United States Patent [19]

Lumsden

[11] Patent Number: 4,659,981
[45] Date of Patent: Apr. 21, 1987

[54] INPUT TRANSFORMER CIRCUIT

[75] Inventor: John L. Lumsden, Boca Raton, Fla.

[73] Assignee: Sony Corporation, Tokyo, Japan

[21] Appl. No.: 779,633

[22] Filed: Sep. 24, 1985

[51] Int. Cl.$^4$ ............................................. H01F 27/42
[52] U.S. Cl. ..................................... 323/356; 330/10; 330/165
[58] Field of Search .............. 323/355, 356, 357, 359, 323/305; 333/177, 180; 330/10, 105, 165, 167, 170

[56] References Cited

U.S. PATENT DOCUMENTS

| | | | |
|---|---|---|---|
| 2,891,214 | 6/1959 | Rogers et al. | 323/356 |
| 3,815,013 | 6/1974 | Milkovic | 323/357 |
| 4,270,061 | 5/1981 | Gronner et al. | 330/165 X |
| 4,360,784 | 11/1982 | Bartlett | 330/10 X |

*Primary Examiner*—Peter S. Wong
*Attorney, Agent, or Firm*—Lewis H. Eslinger; Alvin Sinderbrand

[57] ABSTRACT

An input transformer circuit in which transformer-isolated, balanced inputs are provided operates with low distortion and employs a transformer that has an equal number of turns in the primary and secondary windings and which is operated in the current mode to drive the two inputs of an operational amplifier. One input of the operational amplifier is connected to ground and the circuit operates to drive the other input to virtual ground, so that by transformer action the signal voltage across the ends of the primary winding is essentially zero. Because the signal voltages across the primary and secondary windings of the transformer are both substantially zero, there is relatively no induced electromotive force and no signal distortion occurs in the transformer.

9 Claims, 2 Drawing Figures

INPUT TRANSFORMER CIRCUIT

BACKGROUND OF THE INVENTION

1. Field of the Invention

This invention relates generally to an input transformer circuit and, more particularly, to a circuit involving transformer-isolated balanced inputs in which the transformer is operated in the current mode.

2. Description of the Background

Professional audio equipment must generally operate to higher standards than conventional consumer equipment. For example, the frequency response must be quite flat in the higher frequency ranges and also the resultant sound must be produced with less distortion than is typically tolerated in equipment for home use. By professional audio equipment this is meant to include stereo mixers as might be employed in a recording studio, as well as preamplification circuits, as might be used with high-quality amplifiers, typically having various signal sources, such as tape inputs, tuner inputs, phono inputs, and microphones, for example. In such multi-input circuits, it is well known to utilize an input transformer to provide the correct impedance match between the respective signal source and the input of the preamplifier mixer.

The inputs to such equipment are usually provided through an input transformer, as described above, and it is known to employ input transformers having a relatively large step-up ratio, that is, the primary to secondary turns ratio is large, on the order of 1:50. The problem inherent in such large ratio step-up transformers is that they suffer from poor high-frequency response and also involve relatively high distortion levels. These problems are principally caused by the high secondary impedance, the leakage inductance, and the winding capacitance of the transformer. To overcome this poor high-frequency response problem, various complicated circuits have been proposed and, indeed, are being employed today to provide high-frequency compensation. Because such compensation circuits are relatively complex, the parts and assembly cost of the overall unit is increased and the possibility of a failure is also increased.

OBJECTS AND SUMMARY OF THE INVENTION

Accordingly, it is an object of the present invention to provide an input transformer circuit for providing a balanced input that can eliminate the above-noted defects inherent in the prior art.

Another object of this invention is to provide an input transformer circuit that can accommodate high input signal levels with low distortion in the resultant output signal.

A further object of this invention is to provide an input transformer circuit in which the input transformer is operating in the current mode and provides an excellent common mode rejection ratio (CMRR).

In accordance with an aspect of the present invention, an input transformer circuit is provided in which a transformer has the same number of turns in both the primary and secondary windings and a resistor is connected to each input terminal of the primary winding, with the resistors being of equal value. The secondary of the input transformer is connected to the inverting and noninverting inputs of an operational amplifier, and the noninverting input is connected to ground with negative feedback being provided to the inverting input. In this manner, the transformer is effectively connected between the inverting input of the operational amplifier and ground, thus, by servo action, that is, the power is received from the amplifier element and drives the load, the operational amplifier will always drive the inverting input to the same potential as the non-inverting input, and the inverting input is therefore at virtual ground. Because the transformer is between virtual ground potential and true ground potential, little or no signal will exist across the transformer. Thus, by transformer action (1:1) a similar situation will exist in the primary and, neglecting losses, the signal voltage across the primary is virtually zero. This means that the input impedance can be determined solely by the two resistors of equal value connected to the primary winding of the transformer.

The above and other objects, features, and advantages of the present invention will become apparent from the following detailed description of an illustrated embodiment thereof to read in conjunction with the accompanying drawings.

DETAILED DESCRIPTION OF THE PREFERRED EMBODIMENT

Figure 1:
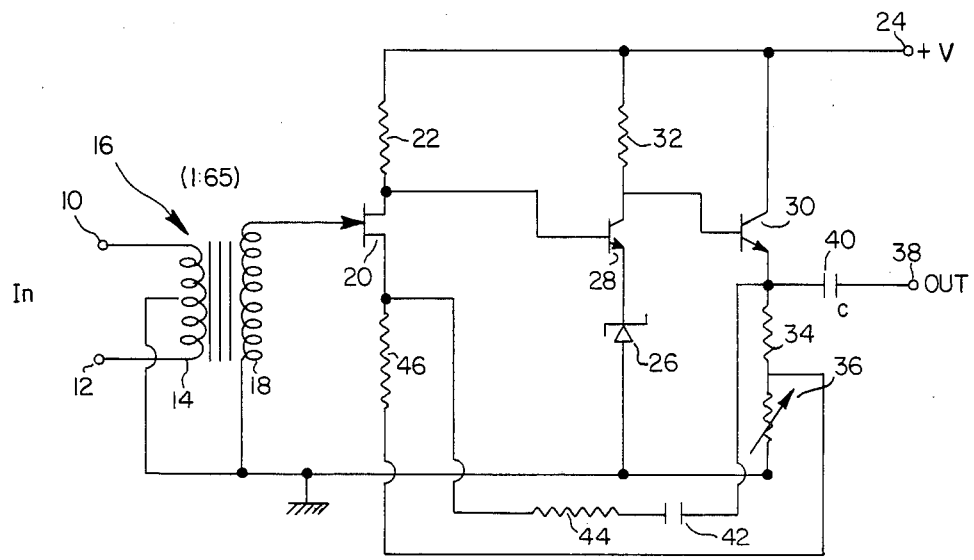
FIG. 1 is a schematic diagram of an input transformer circuit known in the prior art.

In order to better appreciate the advantages provided by the present invention, attention is first directed to a typical prior art input transformer circuit shown in FIG. 1. This input transformer circuit operates as a premixing circuit, such as might be employed in a microphone amplifier, and input terminals 10 and 12 could be connected to a low-impedance microphone, typically having an impedance of between 30 to 50 ohms. Input terminals 10 and 12 are connected to respective ends of the primary winding of an input transformer 16. Transformer 16 is a step-up transformer and the turns ratio between primary winding 14 and the secondary winding 18 of transformer 16 is typically chosen to be relatively high, and in this example such ratio is 1:65. The center tap of primary winding 14 is connected to ground potential, thereby permitting transformer 16 to function as a differential circuit. The output from transformer 16 is from secondary winding 18, one end of which is connected to the gate lead input of a field effect transistor 20 that functions as the input device in the circuit of FIG. 1. Field effect transistors such as this typically provide a good noise figure and, because of the high input impedance, operate with negligible attenuation of the microphone signals. Field effect transistors used in circuits like this are frequently arranged in a common-source configuration, with the input applied between gate and source and the output taken between drain and source. Thus, a drain resistor 22 is connected in series with the drain lead of field effect transistor 20 and a DC bias voltage (+V) applied at terminal 24. The DC conditions for the circuit of FIG. 1 are set by the zener diode 26, which is connected in the emitter circuit of a bipolar transistor 28. The end of zener diode 26 not connected to the emitter of transistor 28 is connected to ground, as is the other end of secondary winding 18 of transformer 16. Transistor 28 has its base lead connected to the drain lead of field effect transistor 20 at the connection with resistor 22. Transistor 28 is biased by a collector resistor 32 connected to DC bias voltage terminal 24 and the output is taken off at the node between the collector of transistor 28 and resistor 32 by the connection to the base of a second bipolar transistor 30. The collector of transistor 30 is connected directly to the DC bias voltage terminal 24, and transistor 30 is connected in the common-emitter configuration with a fixed resistor 34 and a variable resistor 36 connected in series between the emitter and ground potential. The circuit output is then available at terminal 38 connected through a blocking capacitor 40 to the collector of transistor 30.

The DC conditions for the circuit are further set by negative feedback loops applied to the drain of field effect transistor 20. A first feedback loop is connected from the collector of transistor 30, that is, the circuit output through capacitor 42 and resistor 44 to the source lead of field effect transistor 20 and a second feedback loop is connected at the node between series-connected emitter resistors 34 and 36 through series resistor 46 to the source lead of field effect transistor 20. Because of the relatively wide variations present in the $V_{gs}/I_{ds}$ characteristics of field effect transistors, the value of resistance provided by variable resistor 36 in the emitter circuit of output transistor 30 must be adjusted for each individual field effect transistor employed.

Thus, it is seen that a complex compensation circuit is required to try to compensate for the poor high-frequency response caused by the secondary winding of the step-up input transformer.

Figure 2:
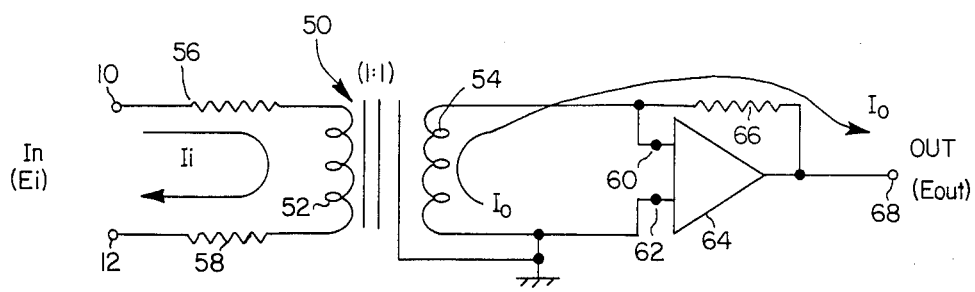
FIG. 2 is a schematic diagram of an input transformer circuit according to an embodiment of the present invention.

An embodiment of the present invention, as shown in FIG. 2, provides an input transformer circuit that does not suffer from the poor frequency response and high distortion levels of the heretofore known prior art circuits. In this circuit, the input signal is again provided at terminals 10 and 12, which may be similarly connected to a low impedance microphone or the like having an impedance between 30 and 50 ohms, however, in this case the input transformer 50 is provided with a turns ratio of 1:1 between its primary winding 52 and secondary winding 54. Connected between one end of primary winding 52 and input terminal 10 is resistor 56 and connected between the other end of primary winding 52 and input terminal 12 is resistor 58. These two resistors 56, 58 have the exact same nominal value and a typical value is 5.1 Kohms, thus, providing an input impedance of approximately 10 Kohms in total. The ends of secondary winding 54, which has the same number of turns as primary winding 42, are connected to the inverting and noninverting inputs 60 and 62, respectively, of an operational amplifier 64. Operational amplifiers are well known and the specific construction need not be shown since such amplifiers are readily commercially available. Briefly, an operational amplifier is a DC amplifier with high gain and excellent stability with negative feedback providing precise control of the response characteristics. Typical operational amplifiers may involve two differential amplifier stages directly coupled in cascade, thereby providing balanced input terminals, which then feed a single output stage. Nevertheless, any known operational amplifier configuration will function properly in this embodiment of the present invention. Feedback is provided by resistor 66, which is connected from the output 68 of operational amplifier 64 to the inverting terminal 60, and the noninverting input 62 of operational amplifier 64 is connected to ground potential, as are the core laminations of transformer 50.

Thus, it is easily seen that the present invention, as embodied in the circuit of FIG. 2, is substantially less complicated than that provided by the prior art circuit.

The operation of the circuit of FIG. 2 is as follows. Operational amplifier 64, by so-called servo action, will always drive the inverting input 60 to a potential which is substantially the same as the noninverting input 62. Therefore, because the noninverting input 62 is at ground potential, the inverting input 60 will be at virtual ground, that is, at apparent ground potential. Now, because the ends of secondary winding 54 of transformer 50 are between virtual ground at terminal 60 and actual ground at terminal 62, it follows that little or no signal voltage can exist across secondary winding 54. By transformer action, and because the number of turns in the primary 52 is equal to the number of turns in the secondary 54, the similar voltage situation exists across primary winding 52, that is, that no voltage difference can be present across the ends of this winding. Thus, the signal voltage $E_I$ appearing across the primary winding 52 is virtually zero.

Nevertheless, the current flowing in the primary circuit, designated $I_i$, can be written as the voltage $E_i$ appearing across the input terminals 10 and 12 divided by the sum of the series resistors 56 and 58 as:

$$I_i = E_i/(R56 + R58) \tag{1}$$

Accordingly, by transformer action of transformer 50 a secondary current $I_0$ will flow through secondary winding 54. The relationship between the input and output signals then can be calculated as follows:

$$E_0 = I_0 \times R66 \tag{2}$$

$$I_0 = I_i = E_i/(R56 + R58) \tag{3}$$

$$E_0 = E_i[R66/(R56 + R58)] \tag{4}$$

Of course, it is seen from the embodiment of FIG. 2 that the overall gain of the inventive input transformer circuit is $R66/(R56+R58)$. Also, note that in the above equations R56 and R58 have the same resistance value.

Now, as described above, the signal voltages appearing across the primary and secondary windings 52 and 54, respectively, are virtually zero, whereby any induced electromotive force (EMF) is necessarily quite small. Therefore, in view of this low EMF, no distortion of the signal will occur between the inputs and outputs of transformer 50.

The common mode rejection ratio (CMRR) of the circuit of FIG. 2 is excellent, provided that the values of resistors 56 and 58 are held to a relatively close tolerance. As is known, electronic components are manufactured with varying degrees of tolerance, and resistors 56 and 58 should be chosen from those manufactured with 1% tolerance. The common mode rejection ratio relates to the ratio of the RMS value of the common mode interference voltage at the input terminals of an operational amplifier and the effect or error produced by such common mode interference at the output of the amplifier when referred to the input, that is, when divided by the gain. Of course, a high ratio is desirable. In that regard, common mode interference refers to interference that appears between both inputs of a differential circuit and a common reference, typically ground potential. Moreover, because of the specific construction of the circuit shown in FIG. 2, very high input signal levels can be tolerated because the input signal voltage is transformed into the current mode by use of the balanced input resistors 56 and 58.

The above description is provided for a single preferred embodiment of the invention, however, it will be apparent that many modifications and variations could be effected by one skilled in the art without departing from the spirit or scope of the novel concepts of the invention, which should be determined only by the appended claims.

What is claimed is:

1. An input transformer circuit, comprising:
   a transformer having core laminations and primary and secondary windings each having first and second ends and an equal number of turns;
   a pair of electrical resistance means, each connected at one end to a respective end of said primary winding of said transformer and an analog audio input signal to the circuit being connected to ends of said pair of electrical resistance means not connected to said primary winding;
   an operationsl amplifier having an inverting input, a non-inverting input, and an output, said ends of said secondary winding being connected respectively to said inverting and non-inverting inputs of said operational amplifier;
   means for connecting said non-inverting input and said transformer core laminations to ground potential; and
   means for connecting said input of said operational amplifier to said inverting input, whereby an input signal connected to said ends of said pair of electrical resistance means produces an output signal, having a linear relationship to said input signal, at said output of said operational amplifier.

2. An input transformer circuit according to claim 1, in which said means for connecting said output of said operational amplifier to said inverting input comprises a resistor, the value of which in combination with said pair of electrical resistance means determines a gain of the circuit.

3. An input transformer circuit according to claim 1, in which said pair of electrical resistance means have substantially equal values of resistance.

4. An input transformer circuit according to claim 3, in which said substantially equal values of resistance are within plus-or-minus 1.0 percent of each other.

5. An input transformer circuit comprising:
   a pair of input terminals for receiving an analog audio signal to be amplified;
   a transformer having core laminations and primary and secondary windings of substantially the same number of turns, said core laminations being connected to ground;
   a pair of resistors having substantially the same value, each resistor being connected between a respective one of said pair of input terminals and an end of said primary winding;
   a feedback resistor; and
   an operational amplifier having an inverting input and a non-inverting input, each respectively connected to an end of said secondary winding of said transformer, wherein said non-inverting input is connected to ground and said inverting input is connected to an output of said operational amplifer through said feedback resistor, an output signal at said output having a linear relationship to said analog input signal.

6. An input transformer circuit, comprising:
   a transformer having core laminations and primary and secondary windings each having an equal number of turns;
   a pair of resistors, one connected to a respective end of said primary winding of said transformer, another end of each of said resistors being adapted to have an analog audio input signal to the circuit qonnected thereto;
   an operational amplifier having an inverting input, a non-inverting input, and an output, an end of said secondary winding being connected to each of said inverting and non-inverting inputs of said operational amplifier;
   means for connecting said transformer core laminations and said non-inverting input to ground; and
   means for connecting said output of said operational amplifier to said inverting input, whereby when said input signal is connected to said pair of resistors an output signal is produced at said output of said operational amplifier that has a linear relationship to said input signal in accordance with a ratio of said means for connecting said output of operational amplifier and said pair of resistors.

7. An input transformer circuit according to claim 6, in which said means for connecting said output of said operational amplifier to said inverting input comprises a third resistor, the value of said third resistor divided by the sum of said pair of resistors determines a gain of the circuit.

8. An input transformer circuit according to claim 6, in which said pair of resistors have substantially equal values of electrical resistance in ohms.

9. An input transformer circuit according to claim 8, in which said substantially equal values of electrical resistance in ohms are within plus-or-minus 1.0 percent of each other.

* * * * *